US012618914B2

(12) United States Patent
Laurent et al.

(10) Patent No.: US 12,618,914 B2
(45) Date of Patent: May 5, 2026

(54) METHOD FOR DETERMINING THE SERVICE LIFE OF AN ELECTROCHEMICAL CELL OF A BATTERY IN REAL TIME

(71) Applicant: SAFT, Levallois-Perret (FR)

(72) Inventors: Sébastien Laurent, Merignac (FR); Sébastien Benjamin, Leognan (FR); Isabelle Sourmey, Boivre-la-Vallee (FR); Romain Cayzac, Beruges (FR); Willy Prodhomme, Amberre (FR); Nicolas Paquin, Paris (FR)

(73) Assignee: SAFT, Levallois-Perret (FR)

( * ) Notice: Subject to any disclaimer, the term of this patent is extended or adjusted under 35 U.S.C. 154(b) by 832 days.

(21) Appl. No.: 17/909,864

(22) PCT Filed: Mar. 11, 2021

(86) PCT No.: PCT/EP2021/056201
§ 371 (c)(1),
(2) Date: Sep. 7, 2022

(87) PCT Pub. No.: WO2021/190948
PCT Pub. Date: Sep. 30, 2021

(65) Prior Publication Data
US 2024/0201270 A1     Jun. 20, 2024

(30) Foreign Application Priority Data

Mar. 24, 2020     (FR) ...................................... 2002869

(51) Int. Cl.
G01R 31/38     (2006.01)
G01R 31/367     (2019.01)
(Continued)

(52) U.S. Cl.
CPC ......... G01R 31/387 (2019.01); G01R 31/367 (2019.01); G01R 31/374 (2019.01); G01R 31/38 (2019.01)

(58) Field of Classification Search
CPC .... G01R 31/387; G01R 31/38; G01R 31/367; G01R 31/374
See application file for complete search history.

(56) References Cited

U.S. PATENT DOCUMENTS

| | | | | |
|---|---|---|---|---|
| 8,035,395 B2 * | 10/2011 | Suzuki | ................. | G01R 31/392 320/132 |
| 10,686,202 B2 * | 6/2020 | Nandjou Dongmeza | ................... C25B 15/02 |
| 2004/0212368 A1 * | 10/2004 | Scott | .................... | G01R 31/389 324/426 |
| 2007/0216366 A1 * | 9/2007 | Inamine | ................. | H01M 6/14 320/132 |

(Continued)

FOREIGN PATENT DOCUMENTS

| | | |
|---|---|---|
| CN | 103592605 A | 2/2014 |
| CN | 109471036 A | 3/2019 |

(Continued)

OTHER PUBLICATIONS

DigiKey. Battery Life Calculator. Year: 2019.*
International Search Report for PCT/EP2021/056201, dated May 14, 2021.

*Primary Examiner* — Lina Cordero
*Assistant Examiner* — Lynda Dinh
(74) *Attorney, Agent, or Firm* — Sughrue Mion, PLLC

(57) ABSTRACT
The present invention relates to a method for determining the lifetime of an electrochemical element of a battery in real time as a function of a determined application, applicable in the field of primary type batteries. The method comprises: —a step (1) of measuring at least one intensity value (I) of the current provided by the electrochemical element and measuring at least one temperature value (T) of the electrochemical element in the determined application; —a step (4) of computing total lifetime allowing the availability time of (Continued)

the electrochemical element to be computed on the basis of a determined initial time, as a function of the one or more current intensity value(s) (I) and of the one or more temperature values (T) measured during the measuring step (1), as a function of a determined value of the capacity of the electrochemical element, of the cut-off voltage of the determined application, and of the background current of the determined application.

18 Claims, 3 Drawing Sheets

(51) Int. Cl.
    *G01R 31/374*        (2019.01)
    *G01R 31/378*        (2019.01)
    *G01R 31/387*        (2019.01)

(56) References Cited

U.S. PATENT DOCUMENTS

| | | | | |
|---|---|---|---|---|
| 2009/0192737 | A1* | 7/2009 | Chen | G01R 31/392 |
| | | | | 702/63 |
| 2013/0229154 | A1* | 9/2013 | Benjamin | G01R 31/378 |
| | | | | 320/132 |
| 2016/0099474 | A1* | 4/2016 | Zhang | H01G 11/30 |
| | | | | 429/50 |
| 2017/0131363 | A1* | 5/2017 | Scott | G01R 31/392 |
| 2021/0218076 | A1* | 7/2021 | Fink | G01R 31/392 |

FOREIGN PATENT DOCUMENTS

| | | | | |
|---|---|---|---|---|
| CN | 110275115 | A | | 9/2019 |
| CN | 111460656 | A | * | 7/2020 |
| DE | 20 2009 000 514 | U1 | | 5/2009 |
| WO | 2008/082288 | A1 | | 7/2008 |

* cited by examiner

METHOD FOR DETERMINING THE SERVICE LIFE OF AN ELECTROCHEMICAL CELL OF A BATTERY IN REAL TIME

CROSS REFERENCE TO RELATED APPLICATIONS

This application is a National Stage of International Application No. PCT/EP2021/056201 filed Mar. 11, 2021, claiming priority based on French Patent Application No. 2002869 filed Mar. 24, 2020.

FIELD OF THE INVENTION

The present invention relates to a method for real-time determination of the service life of an electrochemical cell of a battery. It finds an application in the field of primary-type batteries.

BACKGROUND ART

The determination of the remaining life (or the remaining capacity, or the state of charge) of a primary cell or battery, such as a battery comprising one or more electrochemical cells of the primary lithium type, for example of the lithium thionyl chloride type (LiSOCl$_2$), is a particularly important problem in many applications that use this type of cell or battery, in order to anticipate the replacement of a discharged battery.

Solutions for determining the remaining service life of a battery are known, which consist in performing a measurement of the voltage across the battery and using a characteristic curve of the no-load voltage of this battery as a function of its state of charge. However, such solutions are not suitable for application to lithium thionyl chloride electrochemical cells, because in this case the no-load voltage is constant throughout the life of the battery and drops only at the very end of battery life. Applying such a solution therefore is equivalent to generating an alarm indicating to the user that the battery must be replaced, at the very end of service life of the battery, and therefore without actual possibility of anticipating replacement of the battery.

Other solutions for determining the remaining life of a primary cell, particularly of the LiSOCl$_2$ type, are also known, which also involve measuring the voltage across the battery, and then analyzing the voltage response to making a demand on the battery. However, this method is complex because it is based on a very fast data acquisition frequency as well as a very precise estimation of the state of passivation of the battery. In the absence of a sufficiently rapid frequency and a sufficiently accurate estimate, the result may be false. Moreover, the conditions under which the demand is made of the battery (current, temperature . . . ) must be reproducible so that results are comparable. This method is therefore difficult to implement.

It is also known from document CN103592605, a method for determining the remaining capacity of a primary cell of the LiSOCl$_2$ type from a measurement of current and temperature. However, this method is based on a calculation of capacity loss by a coulometric method (calculation of the Amps-hours discharged) as well as taking account of calendar self-discharge (as a function of temperature only). This method is nevertheless not satisfactory because it does not take the specificities of each application into account.

More generally, the known methods are based on the use of theoretical usage profiles. However, if the usage differs from what is expected, the estimate is false with the consequences of either no longer having energy available to perform an operation if the usage has been under-estimated, or the premature replacement of a battery if the usage has been over-estimated.

Thus, the aim of the invention is to solve in particular the aforementioned problems, by providing a method for determining in real time the service life of an electrochemical cell of a primary battery which is accurate, and which takes into account the specificities of each application.

SUMMARY OF THE INVENTION

The invention therefore provides, in a first aspect, a method for real-time determination of the service life of an electrochemical cell of a primary battery as a function of a determined application, the method comprising:

a step of measuring at least one value for current supplied by the electrochemical cell and at least one temperature value of the electrochemical cell in the determined application, a total service life calculation step for calculating availability time of the electrochemical cell starting from a determined initial time, as a function of the at least one current value and the at least one temperature value measured during the measurement step, as a function of a determined value of capacity of the electrochemical cell, cut-off voltage for the determined application, and background current for the determined application.

Depending upon applications, the background current can represent the majority consumption of a primary battery. This background current corresponds to the permanent consumption of the electronics of the application in question: leakage current of each of the electronic components of the system (for example: consumption of a microcontroller in standby mode).

In some embodiments, the method further comprises one or more of the following features, taken alone or in all technically possible combinations:

the total service life calculation step implements calculation of availability time of the electrochemical cell from the determined initial time using the formula $C \times Kp \times R / (Imoy + Iad)$, wherein:

C corresponds to the determined value of capacity of the electrochemical cell,

Kp corresponds to a cutoff coefficient of the electrochemical cell and is a function, firstly of a maximum current value (Imax) drawn by the determined application and, secondly the cut-off voltage for the determined application, Imoy corresponds to an average value of the current drawn by the determined application obtained from the one or more value(s) of the current supplied by the electrochemical cell, and including the value for background current for the determined application, R corresponds to performance in terms of capacity of the electrochemical cell and is a function, firstly of the average value (Imoy) or the maximum value (Imax) of the current drawn by the determined application and, secondly temperature of the electrochemical cell in the determined application, Iad corresponds to a value of the self-discharge current of the electrochemical cell and is a function, firstly of the average value of the current (Imoy) drawn by the determined application and, secondly temperature of the electrochemical cell in the determined application;

the values of R and Iad are obtained from respective tables associating performance in terms of capacity values R, respectively self-discharge current Iad values, with pairs of values representing mean Imoy or maximum Imax current and temperature;

the value of Kp is obtained from a table associating cutoff coefficient values Kp with pairs of values representing maximum current Imax and cut-off voltage;

the value for background current is obtained by measurement, or is a parameterizable constant;

prior to the step of calculating total service life, a step of storing a profile for the determined application is implemented, during which a value for maximum current (Imax), a value for average current Imoy, and the one or more temperature value(s) measured in measuring step are stored;

the one or more temperature value(s) are stored in a table in association with durations of exposure corresponding to durations during which exposure to the respective temperatures has occurred;

the temperature values are grouped together by temperature thresholds, and the table associates durations of exposure with temperature thresholds;

the method comprises a step of checking for the existence of a request for calculating service life, and, if the result of the checking step is positive, the step of calculating service life is implemented, otherwise the steps of measuring and storage are successively carried out again;

the method comprises storing elapsed time starting from the determined initial time, and calculating the remaining service life of the electrochemical cell by subtracting said elapsed time from service life calculated in the service life calculation step;

the method comprises calculating state of charge of the electrochemical cell by dividing the remaining service life by the service life calculated during the service life calculation step;

the determined value of capacity corresponds to the nominal capacity of the electrochemical cell, and the determined initial time corresponds to the time production of the electrochemical cell was completed;

the determined value of capacity corresponds to the nominal capacity of the electrochemical cell minus a loss of capacity during a determined period, such as a storage period, and the determined initial time corresponds to the time at which the electrochemical cell is put into use for the first time and is determined to be the time production of the electrochemical cell was completed plus the duration of the determined period.

The invention also provides, according to a second aspect, a computer program product comprising instructions which, when said program is executed by a computer, cause said computer to carry out the above method, from measuring at least one value for current supplied by the electrochemical cell and at least one temperature value of the electrochemical cell in the determined application.

The invention also provides, according to a third aspect, a system for managing a device or installation comprising a battery, said battery comprising at least one electrochemical cell, the system comprising:

means for measuring at least one value for current supplied by the electrochemical cell and at least one temperature value of the electrochemical cell in the determined application;

electronic or computer computing means programmed to carry out the above method from the measurement of at least one value for current supplied by the electrochemical cell and at least one temperature value of the electrochemical cell in the determined application.

The invention also provides, according to a fourth aspect, a battery comprising at least one electrochemical cell. The battery further includes means for measuring at least one value for current supplied by the electrochemical cell and at least one temperature value of the electrochemical cell in a determined application of said electrochemical cell, and electronic computing means programmed to carry out the above method from the measurement of at least one value for current supplied by the electrochemical cell and at least one temperature value of the electrochemical cell in the determined application Preferably, said at least one electrochemical cell is of the $LiSOCl_2$ type.

Thus, the method of the invention makes it possible to determine the total service life and the remaining life of a primary battery, taking into account the specificities of the application in which the battery is used, therefore with higher accuracy.

Indeed, the maximum capacity, known as nominal capacity, is not a constant theoretical value, it differs depending on the application. However, unlike the solutions of the prior art, the method of the invention makes it possible to recalibrate 10 this maximum capacity depending upon the use.

Furthermore, the method of the invention takes into account:

maximum current of the application, cut-off voltage of the application, an average current of the application, temperature of the application background current.

It should not be forgotten that, depending on the application, background current can represent the majority consumption of a primary battery. This background current corresponds to the permanent consumption of the electronics of the application in question: leakage current of each of the electronic components of the system (for example: consumption of a microcontroller in standby mode).

The features and advantages of the invention will become apparent upon reading the description which will follow, given solely by way of example, and non-limiting, with reference to the following appended drawings.

DETAILED DESCRIPTION OF EMBODIMENTS

Figure 1:
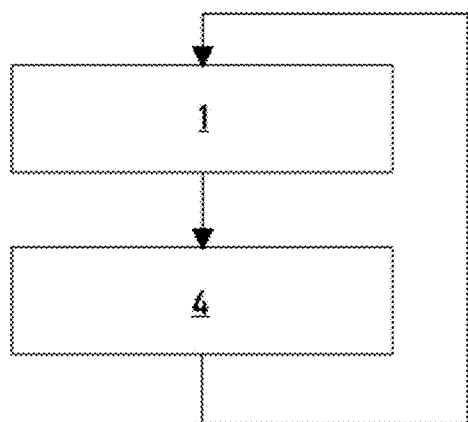
FIG. 1 is a schematic representation of the method of the invention in a first embodiment.
Figure 2:
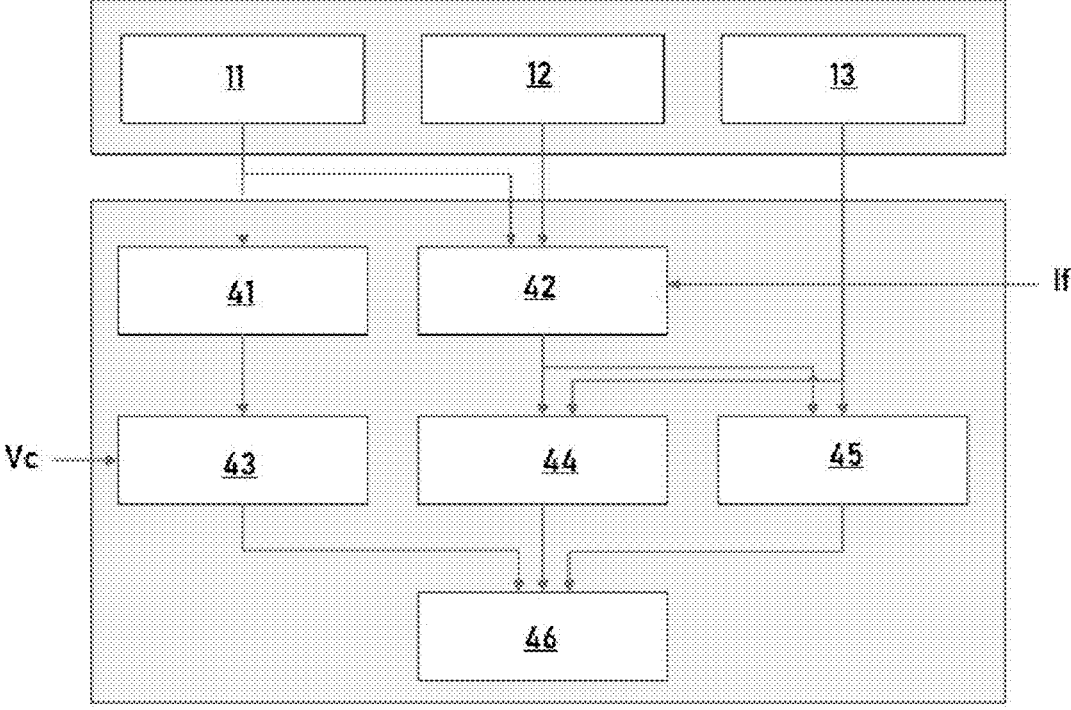
FIG. 2 is a more detailed schematic representation of the example of FIG. 1.

Various embodiments of the method of the invention are presented hereinafter, with reference to FIGS. 1 to 5.

The method for real-time determination of the service life of an electrochemical cell of a primary battery, such as an electrochemical cell of the $LiSOC_2$ type, comprises a measurement step 1 and a step of calculating total service life 4.

Measuring step 1 makes it possible to measure at least one value of a current I supplied by the electrochemical cell (step 11) and at least one temperature value T of the electrochemical cell (step 13), in a determined application.

The total service life calculation step 4 makes it possible to calculate availability time of the electrochemical cell starting from a determined initial time, as a function of the one or more current value(s) I and the one or more temperature value(s) T measured during measurement step 1, as a function of a determined value of capacity of the electrochemical cell, of cut-off voltage Vc for the determined application, and of background current If for the determined application.

Calculation of the total service life of the electrochemical cell, implemented in step 4, makes it possible to calculate availability time of the electrochemical cell starting from the determined initial time using the following formula:

$$C \times Kp \times R / (Imoy + Iad)$$

In this formula:

C corresponds to the determined value for capacity of the electrochemical cell

Kp corresponds to a cutoff coefficient of the electrochemical cell,

Imoy corresponds to an average value of the current drawn by the determined application, R corresponds to performance in terms of capacity of the electrochemical cell, Iad corresponds to a value of the self-discharge current of the electrochemical cell.

The cutoff coefficient Kp of the electrochemical cell (step 43) is a function of firstly maximum current Imax drawn by the determined application (obtained in step 41) and secondly cut-off voltage (Vc) for the determined application.

The value of Kp can be obtained from a table associating cutoff coefficient values Kp with pairs of values representing maximum current Imax and cutoff voltage Vc.

The average value of the current Imoy drawn by the determined application (step 42) is obtained from one or more value(s) of the current I supplied by the electrochemical cell. It includes the value for background current If of the determined application.

For the implementation of step 42, the time that has elapsed since the previous implementation of the method, previously determined in step 12, can be used in the context of the main measurement step 1.

The value for the background current If can be obtained, for example by measurement. If the value for current measured is less than the known value for the background current, it is considered that the value for current measured is equal to the value for background current If. Another method could be to permanently add an estimated value for background current to the measured value for current of the electrochemical cell. Alternatively, this value may be a parameterizable constant for the method.

Efficiency in terms of capacity R of the electrochemical cell (step 44) is a function of firstly, the average value Imoy or of the maximum value Imax of the current drawn by the determined application and secondly of the temperature of the electrochemical cell in the determined application.

A value for efficiency in terms of capacity R can be obtained, for example, from a table associating values of efficiency in terms of capacity R with pairs of values representing mean current Imoy or maximum current Imax and temperature T.

The value of self-discharge current Iad of the electrochemical cell (step 45) is a function of firstly the average value of current Imoy drawn by the determined application and secondly the temperature of the electrochemical cell in the determined application.

Just like for efficiency in terms of capacity R, values for self-discharge current can be obtained, for example from a table associating self-discharge current values Iad with mean current Imoy and temperature T value parings.

Once these different values have been obtained, calculation of the service life of the electrochemical cell using the formula previously indicated is carried out (step 46).

Figure 3:
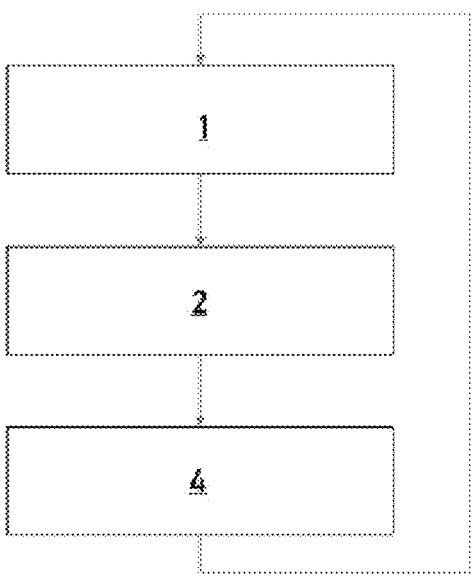
FIG. 3 is a schematic representation of the method of the invention in a second embodiment.
Figure 4:
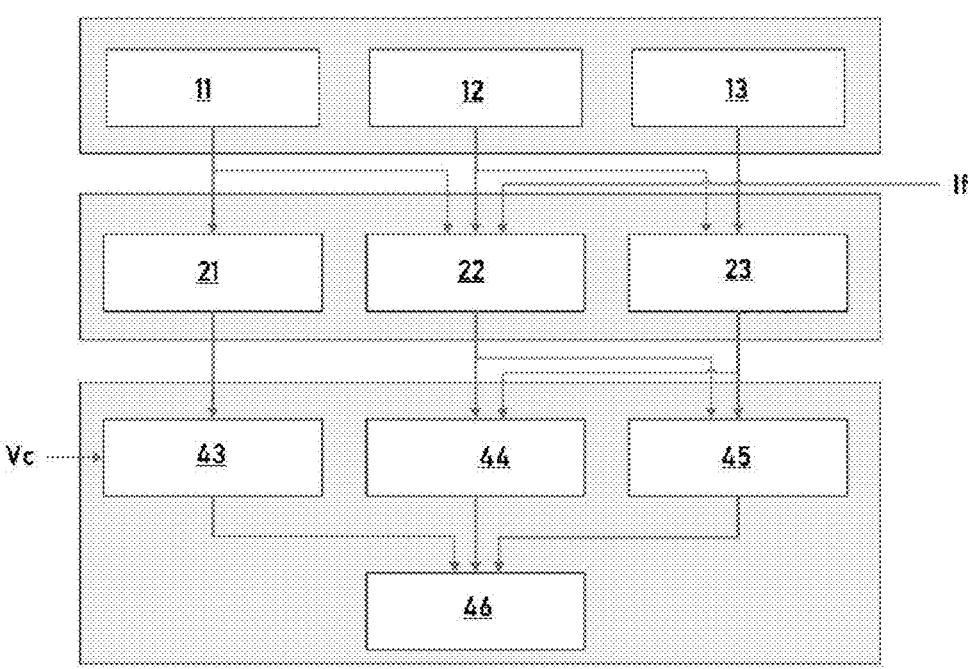
FIG. 4 is a more detailed schematic representation of the example of FIG. 3.
Figure 5:
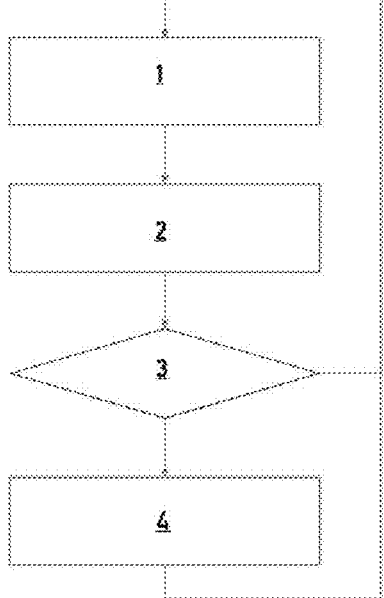
FIG. 5 is a schematic representation of the method of the invention in a third embodiment.

In the particular embodiments shown in FIGS. 3 and 5, prior to the step of calculating the total service life 4, a step of storing a profile (step 2) for the determined application is implemented.

In this step of storing the profile 2, the value for maximum current Imax is stored (step 21) and a value for average current Imoy is stored (step 22). Furthermore, the temperature value or values T measured in measurement step 1 are also stored (step 23).

More specifically, step 23 implements storage of the one or more temperature value(s) T in a table in association with durations of exposure to that temperature. These exposure times correspond to durations during which exposure to the respective temperatures T has occurred.

For the implementation of steps 22 and 23, the time elapsed since the previous implementation of the method, previously determined in step 12 in the context of the main measurement step 1, can be used.

Preferably, the temperature values T are grouped together by temperature thresholds T Thus, the table in question associates durations of exposure with temperature thresholds T.

In the particular embodiment shown in FIG. 5, provision is made to only calculate the service life of the electrochemical cell on demand. Thus, a checking step 3 is implemented, during which a check is made for the existence of a request for calculating the service life of the electrochemical cell. If the result of this checking step 3 is positive, the step of calculating service life 4 is implemented. Otherwise, the steps of measuring 1 and storage 2 are successively carried out again.

In the context of the implementation of the method of the invention by a computer programmed to this effect (see explanations below), the particular embodiment presented above makes it possible to separate the activities of measurement (step 1) from the profile storage activity (step 2) with little consumption in terms of calculation overhead, for continuous storage of useful data related to the profile, from service life calculation part (step 4) which has a much higher calculation overhead, to just do service life calculation from time to time.

Provision may be made for storage of the time that has elapsed since the determined initial time. The remaining service life of the electrochemical cell can then be obtained by subtracting the elapsed time from the service life calculated during service life calculation step 4.

The state of charge of the electrochemical cell can also be calculated by dividing the remaining service life previously calculated by the service life calculated during service life calculation step 4.

In the method of the invention, the determined value of capacity used can correspond to the nominal capacity of the electrochemical cell. The determined initial time then corresponds to the time production of the electrochemical cell finished.

Alternatively, the determined value of capacity used in the method corresponds to the nominal capacity of the electrochemical cell minus a loss of capacity during a determined period. The determined initial time then corresponds to the time at which the electrochemical cell is put into use for the first time and is determined to be the time production ended plus the duration of the determined period. This determined period may, for example, correspond to a storage period, between the production of the electrochemical cell and the actual commissioning thereof.

The method of the invention can be implemented by a computer. It is then stored as instructions of a computer program product. When the program is executed by the computer in question, the instructions of the program cause the computer to carry out the method of the invention, from the measurement of at least one value for current I supplied by the electrochemical cell and at least one temperature value T of the electrochemical cell, in the determined application.

The method of the invention can also be implemented by a system for managing a device or an installation comprising a battery with at least one electrochemical cell.

Such a system conventionally comprises electronic or computer computing means. It further comprises measurement means.

The calculation electronics or computational means are programmed to implement the method of the invention, from measurement, by the measurement means, of at least one value for current I supplied by the electrochemical cell and at least one temperature value T of the electrochemical cell in the determined application.

It is also possible to provide for the battery to include its own measurement means, and its own electronic calculation means. These electronic calculation means are then programmed to implement the method of the invention, from measurement, by these measurement means, of at least one value for current I supplied by the electrochemical cell and at least one temperature value T of the electrochemical cell in the determined application.

The method disclosed in the invention is applicable to all liquid-cathode primary lithium-type electrochemistries, for example of the LiSOCl$_2$ type and is also potentially applicable to solid-cathode primary lithium electrochemistries, for example of the LiMnO$_2$ or LiCFx type.

What is claimed is:

1. A method for real-time determination of a service life of an electrochemical cell of a primary battery as a function of a determined application, the method comprising:

measuring, from the electrochemical cell in the determined application, at least one current value (I), supplied by the electrochemical cell, and at least one temperature value (T); and determining the service life by calculating an availability time, of the electrochemical cell and starting from a determined initial time, based on the at least one current value (I) and the at least one temperature value (T), as measured from the electrochemical cell in the determined application, and further based on a capacity (C) of the electrochemical cell, a cut-off voltage (Vc) for the determined application, a background current (If) for the determined application, and by determining C×Kp×R/(Imoy+Iad), wherein Kp is a cutoff coefficient (Kp) of the electrochemical cell and is a function of both a maximum current value (Imax), drawn by the determined application, and the cut-off voltage (Vc) for the determined application, Imoy is an average current (Imoy) drawn by the determined application, is obtained from the at least one current value (I), and includes the background current (If) for the determined application, R is a performance (R) in terms of capacity of the electrochemical cell and is a function of both a temperature, of the electrochemical cell in the determined application, and any of the average current (Imoy) and the maximum current value (Imax) drawn by the determined application, and Iad is a self-discharge current (Iad) of the electrochemical cell and is a function of both the average current (Imoy), drawn by the determined application, and the temperature of the electrochemical cell in the determined application.

2. The method according to claim 1, wherein the performance (R) and the self-discharge current (Iad) are obtained from respective tables associating the performance (R) and the self-discharge current (Iad) with pairs of values of the at least one temperature value (T) and the any of the average current (Imoy) and the maximum current value (Imax).

3. The method according to claim 1, wherein the cutoff coefficient (Kp) is obtained from a table associating the cutoff coefficient (Kp) with pairs of values representing the maximum current value (Imax) and the cut-off voltage (Vc).

4. The method according to claim 1, wherein the background current (If) is any of obtained by measurement and as a parameterizable constant.

5. The method according to claim 1, further comprising, before determining the service life by calculating the availability time and after measuring the at least one current value (I) and the at least one temperature value (T) storing a profile, for the determined application, the maximum current (Imax), the average current (Imoy), and the at least one temperature value (T).

6. The method according to claim 5, wherein the at least one temperature value (T) is stored in a table in association with durations of exposure, representing at least one duration, during which exposure to the at least one temperature value (T) has occurred.

7. The method according to claim 5, further comprising checking for a request to calculate the service life, and based on identifying, while checking for the request, that the request has been received, calculating the service life (4), and based on identifying, while checking for the request, that the request has not been received, implementing:

another measuring, from the electrochemical cell in the determined application, of the at least one current value (I), supplied by the electrochemical cell, and the at least one temperature value (T); and another storing of the profile, for the determined application, the maximum current (Imax), the average current (Imoy), and the at least one temperature value (T).

8. The method according to claim 6, wherein, in the table, the at least one temperature value (T) is grouped, by temperature thresholds (T), with other temperature values, and the temperature thresholds are associated in the table with the durations of exposure.

9. The method according to claim 1, further comprising storing an elapsed time, starting from the determined initial time, and calculating, as a change to the service life, a remaining service life of the electrochemical cell by subtracting the elapsed time from the service life.

10. The method according to claim 9, further comprising calculating a state of charge of the electrochemical cell by dividing a value of the remaining service life by a value of the service life.

11. The method according to claim 1, wherein the capacity (C) of the electrochemical cell corresponds to a nominal capacity of the electrochemical cell, and the determined initial time corresponds to a time at which production of the electrochemical cell was completed.

12. The method according to claim 1, wherein the capacity (C) of the electrochemical cell corresponds to a nominal capacity of the electrochemical cell minus a capacity loss during a determined period, and the determined initial time corresponds to a time at which the electrochemical cell was put into use for a first time and is determined to be a time at which production of the electrochemical cell was completed plus a duration of the determined period.

13. A non-transitory computer-readable storage medium comprising instructions which, when executed by a computer, cause said computer to carry out the method according to claim 1.

14. A system for managing a device or installation comprising a battery, said battery comprising at least one electrochemical cell, the system comprising:

means for measuring at least one value for the at least one current value (I) supplied by the electrochemical cell and the at least one temperature value (T) of the electrochemical cell in the determined application; and electronic or computer computing means programmed to carry out the method according to claim 1.

15. A battery comprising:

at least one electrochemical cell;

means for measuring at least one value for the at least one current value (I) supplied by the electrochemical cell and at least one temperature value (T) of the electrochemical cell in the determined application of said electrochemical cell; and electronic computing means programmed to carry out the method according to claim 1.

16. The battery of claim 15 wherein the at least one electrochemical cell is of a $LiSOCl_2$ type.

17. The battery of claim 16, wherein the at least one electrochemical cell is of the $LiSOCl_2$ type as a primary cell with a liquid cathode of the $LiSOCl_2$ type.

18. The battery of claim 17, wherein the primary cell comprises a constant no-load voltage, flat profile, throughout a life of the primary cell.

* * * * *